United States Patent
Choi et al.

(10) Patent No.: US 11,756,867 B2
(45) Date of Patent: Sep. 12, 2023

(54) POWER MODULE INCLUDING LEAD FRAME UNIT CONNECTING FIRST SUBSTRATE AND SECOND SUBSTRATE

(71) Applicant: LG ELECTRONICS INC., Seoul (KR)

(72) Inventors: Siho Choi, Seoul (KR); Seongmoo Cho, Seoul (KR); Oksun Yu, Seoul (KR); Kwangsoo Kim, Seoul (KR); Gun Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 349 days.

(21) Appl. No.: 17/038,429

(22) Filed: Sep. 30, 2020

(65) Prior Publication Data

US 2021/0257280 A1    Aug. 19, 2021

(30) Foreign Application Priority Data

Feb. 13, 2020 (KR) .................. 10-2020-0017885

(51) Int. Cl.
*H01L 23/495* (2006.01)
*H05K 7/02* (2006.01)

(52) U.S. Cl.
CPC .. *H01L 23/49524* (2013.01); *H01L 23/49541* (2013.01); *H01L 23/49579* (2013.01); *H05K 7/026* (2013.01)

(58) Field of Classification Search
CPC . H01L 23/495–49596; H01L 23/49861; H01L 21/4821–4842
See application file for complete search history.

(56) References Cited

U.S. PATENT DOCUMENTS

| | | | |
|---|---|---|---|
| 2007/0145540 A1* | 6/2007 | Mochida | H01L 24/36 257/659 |
| 2007/0236891 A1 | 10/2007 | Mamitsu | |
| 2008/0122075 A1 | 5/2008 | Bauer et al. | |
| 2010/0133672 A1 | 6/2010 | Mock et al. | |
| 2018/0082921 A1 | 3/2018 | Grassmann et al. | |

FOREIGN PATENT DOCUMENTS

| | | |
|---|---|---|
| EP | 1696484 A1 | 8/2006 |
| JP | 2007311441 A | 11/2007 |
| WO | 2012096066 A1 | 7/2012 |
| WO | 2019037867 A1 | 2/2019 |

\* cited by examiner

*Primary Examiner* — Laura M Menz
*Assistant Examiner* — Candice Chan
(74) *Attorney, Agent, or Firm* — Bryan Cave Leighton Paisner LLP

(57) ABSTRACT

A power module is disclosed. A power module according to an embodiment of the present disclosure may include a first substrate and a second substrate spaced apart from each other, an electronic device unit provided on at least either one of the first and second substrates, and a lead frame unit provided between the first and second substrates. One side of the lead frame unit may be connected to an external circuit, and the other side thereof may be configured to electrically connect the first and second substrates. Accordingly, the lead frame unit may perform a function of electrically connecting the first and second substrates instead of a via spacer in the related art.

8 Claims, 10 Drawing Sheets

FIG. 14
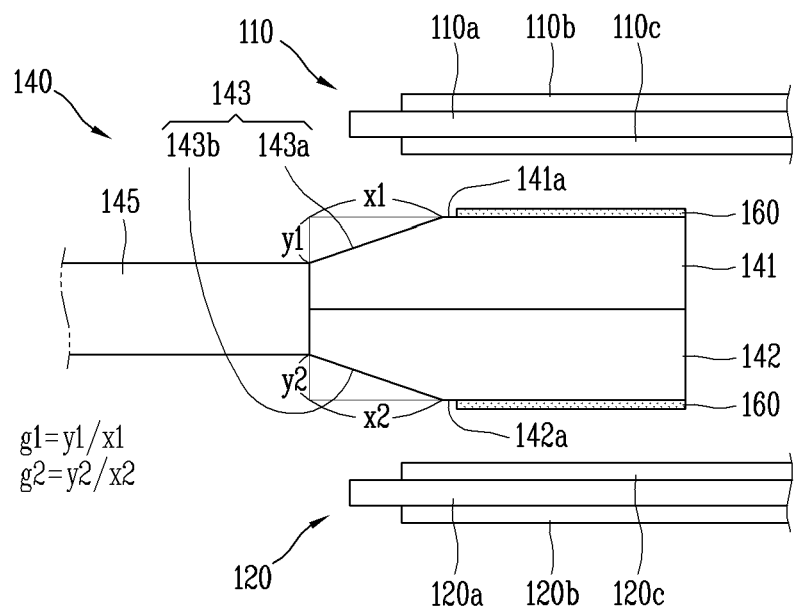
(a)
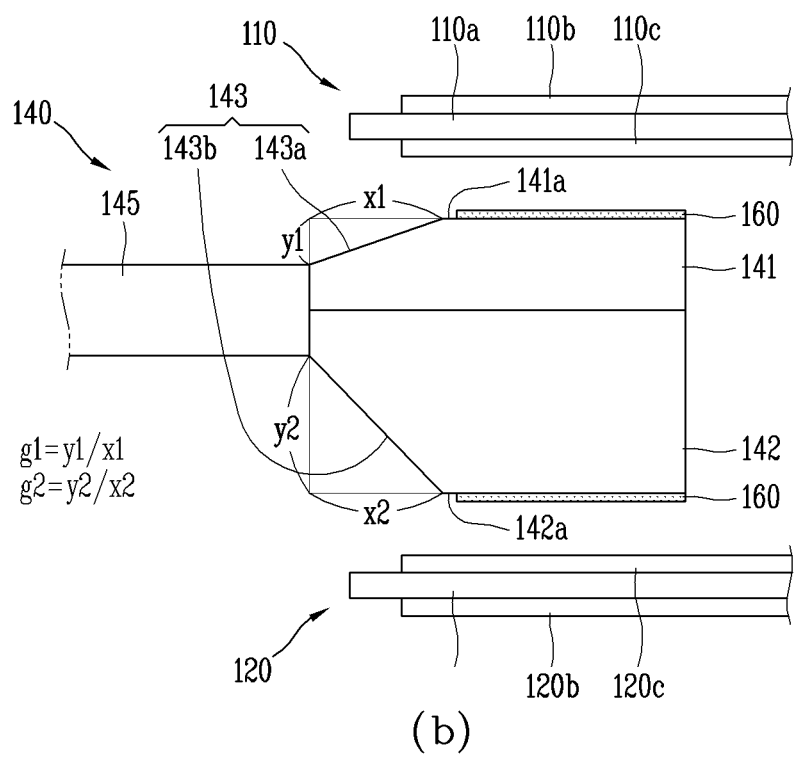
(b)

POWER MODULE INCLUDING LEAD FRAME UNIT CONNECTING FIRST SUBSTRATE AND SECOND SUBSTRATE

CROSS-REFERENCE TO RELATED APPLICATIONS

Pursuant to 35 U.S.C. § 119(a), this application claims the benefit of an earlier filing date of and the right of priority to Korean Patent Application No. 10-2020-0017885, filed Feb. 13, 2020, which is incorporated by reference herein in its entirety.

BACKGROUND

1. Technical Field

The present disclosure relates to a power module having a lead frame configured to electrically connect two substrates.

2. Description of the Related Art

An eco-friendly vehicle powered by hydrogen or electricity includes a power conversion device. Furthermore, one of the key components of the power conversion device is a power module. Along with the development of eco-friendly vehicles, technology development for improving the performance of these power modules has been carried out.

During operation, the power module exhibits a high heat generation amount around electrical devices, and a temperature rise of the power module directly affects the performance and durability of the power module. Accordingly, the main technical development areas of the power module include further improving the cooling performance of the power module.

A cooling method of the power module may be divided into single side cooling and double side cooling according to a side to be cooled, and classified into a direct cooling method and an indirect cooling method according to a cooling method.

Meanwhile, a double side cooling type power module may include a via spacer disposed between two substrates. One surface and the other surface of the via space are disposed respectively in contact with one surfaces of the two substrates facing each other to electrically connect the two substrates. For example, the via spacer may be made of copper.

However, in the case of a power module having a via spacer, the volume itself of the via spacer acts as a factor of increasing electrical resistance. In addition, an increase of electrical resistance caused by the via spacer increases a heat generation amount of the power module.

Moreover, in the case of a double side cooling type power module having a via spacer, a space for arranging the via spacer on a substrate of the power module must be additionally secured, and accordingly, a structure of the power module may be somewhat complicated.

SUMMARY

An aspect of the present disclosure is to provide a double side cooling type power module from which a via spacer that has been applied to a double side cooling type power module in the related art is removed.

In order to achieve an object of the present disclosure, a power module may include a first substrate and a second substrate spaced apart from each other; an electronic device unit provided on at least either one of the first and second substrates; and a lead frame unit, one side of which is connected to an external circuit, and the other side of which is provided between the first and second substrates, to electrically connect the first and second substrates.

The lead frame unit may be provided in a plural number, and configured with a first lead frame and a second lead frame, respective one sides of which are connected to different regions of the external circuit, and the other side of at least either one of the first and second lead frames may be disposed in contact with the first substrate to electrically connect the first and second substrates.

The other side of the first lead frame may be disposed in contact with the first substrate to electrically connect the first and second substrates, and the other side of the second lead frame may be disposed in contact with the second substrate.

Each of the first and second lead frames may define a transmission path for at least either one of power and signals through the external circuit.

The lead frame unit may include a contact portion provided at the other side of the lead frame unit, and configured to have a contact surface in contact with one surface of the first substrate facing the second substrate.

The lead frame may further include an inclined portion provided at the other side of the lead frame unit, and disposed to be inclined toward one surface of the first substrate facing the second substrate, and configured to define a slope having a predetermined amount with respect to one surface of the substrate.

The lead frame unit may further include a terminal portion provided at one side of the lead frame unit to be connected to the external circuit, and a bottom surface of the terminal portion may be disposed on the same height as that of one surface of the second substrate facing the first substrate.

The contact portion may be configured to have elasticity deformed toward one surface of the first substrate facing the second substrate.

The lead frame unit may include a first portion provided at the other side of the lead frame unit, and configured to have a first contact surface in contact with one surface of the first substrate facing the second substrate; and a second portion provided at the other side of the lead frame unit, and configured to have a second contact surface in contact with one surface of the second substrate facing the first substrate, wherein the first portion and the second portion are spaced apart from each other at a predetermined interval to define a gap portion between the first and second portions.

At least either one of the first portion and the second portion may be configured to have elasticity deformed toward one surface of the first substrate or one surface of the second substrate facing each other.

The lead frame unit may include a first portion provided at the other side of the lead frame unit, and configured to have a first contact surface in contact with one surface of the first substrate facing the second substrate; and a second portion provided at the other side of the lead frame unit, and configured to have a second contact surface in contact with one surface of the second substrate facing the first substrate, wherein the first portion and the second portion are disposed such that one surfaces facing each other are brought into contact with each other to constitute a single body.

The lead frame unit may include an inclined portion provided at the other side of the lead frame unit, and disposed to be inclined toward at least either one of one surfaces of the first and second substrates facing each other.

The inclined portion may include a first inclined surface disposed to be inclined toward one surface of the first substrate facing the second substrate; and a second inclined surface disposed to be inclined toward one surface of the second substrate facing the first substrate.

The first inclined surface may be configured to define a first slope with respect to one surface of the first substrate facing the second substrate, and the second inclined surface may be configured to define a second slope with respect to one surface of the second substrate facing the first substrate, and the first and second inclined surfaces may be disposed such that the first and second slopes are different from each other.

The first inclined surface may be configured to define a first slope with respect to one surface of the first substrate facing the second substrate, and the second inclined surface may be configured to define a second slope with respect to one surface of the second substrate facing the first substrate, and the first and second inclined surfaces may be disposed such that the first and second slopes are the same as each other.

At least either one of the first substrate and the second substrate may include a dielectric layer portion made of a dielectric material; and a first metal layer portion and a second metal layer portion made of metal, and respectively bonded onto both sides of the dielectric layer portion.

At least either one of the first metal layer portion and the second metal layer portion may be made of copper, respectively.

The electronic device unit may include a first electronic device provided on the first substrate; and a second electronic device provided on the second substrate, wherein the lead frame unit provides a transmission path for power and signals between the first and second electronic devices and the external circuit.

The power module may further include a spacer provided between the electronic device unit and either one of the first and second substrates.

BRIEF DESCRIPTION OF THE DRAWINGS

FIG. 14 is a conceptual view showing still another example of the lead frame unit illustrated in FIG. 12.

DETAILED DESCRIPTION OF THE EMBODIMENTS

Hereinafter, a power module 100 associated with the present disclosure will be described in detail with reference to the accompanying drawings.

According to the present specification, the same or similar elements are designated with the same numeral references even in different embodiments and their redundant description will be omitted.

Unless clearly indicated otherwise, expressions in the singular number include a plural meaning.

Figure 1:
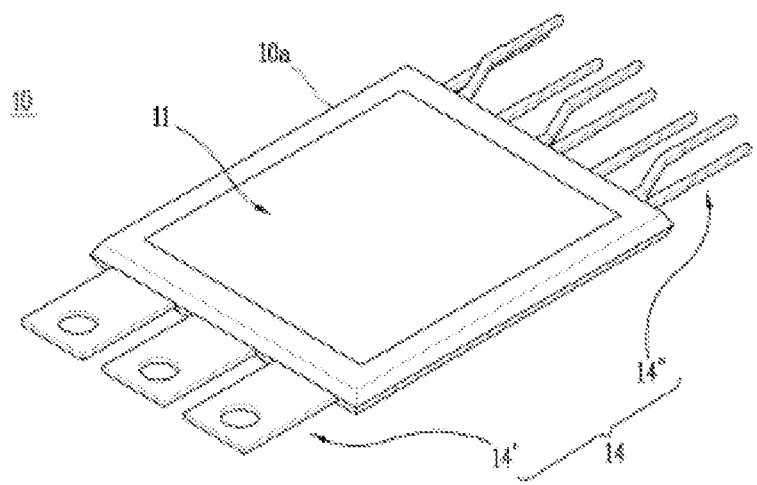
FIG. 1 is a perspective view showing an example of a power module in the related art.
Figure 2:
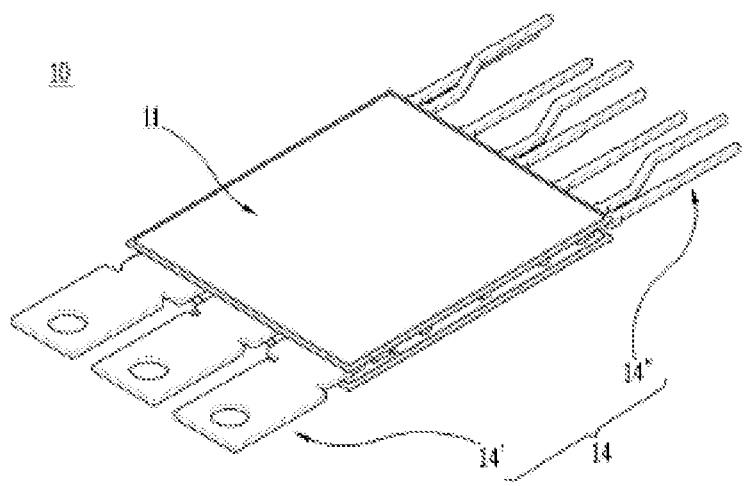
FIG. 2 is a perspective view showing an inside of the power module illustrated in FIG. 1.
Figure 3:
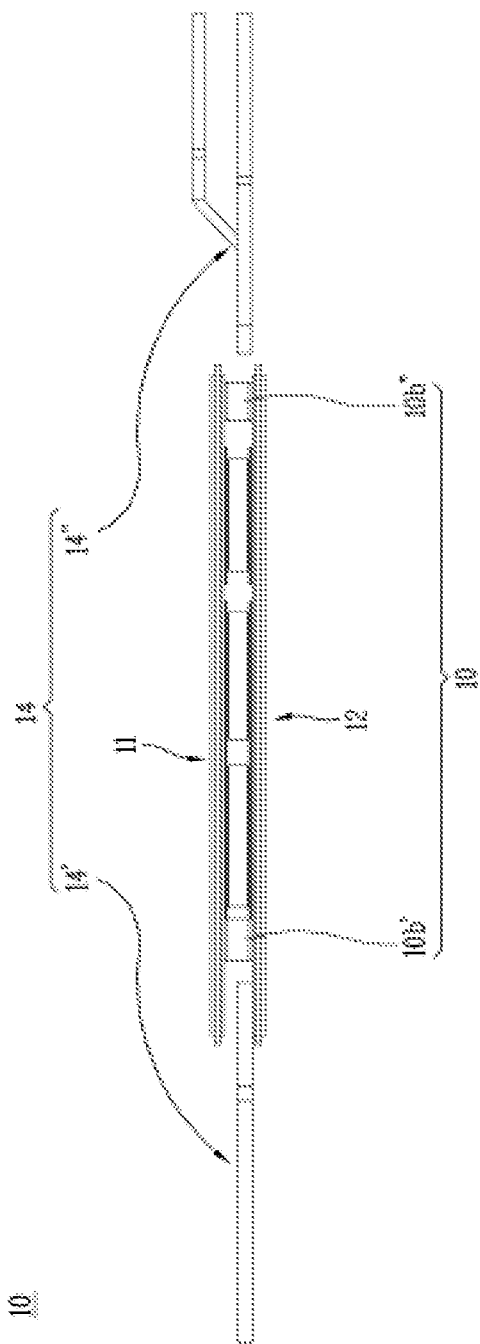
FIG. 3 is a conceptual view of the inside of the power module illustrated in FIG. 2 when viewed from a lateral side.
Figure 4:
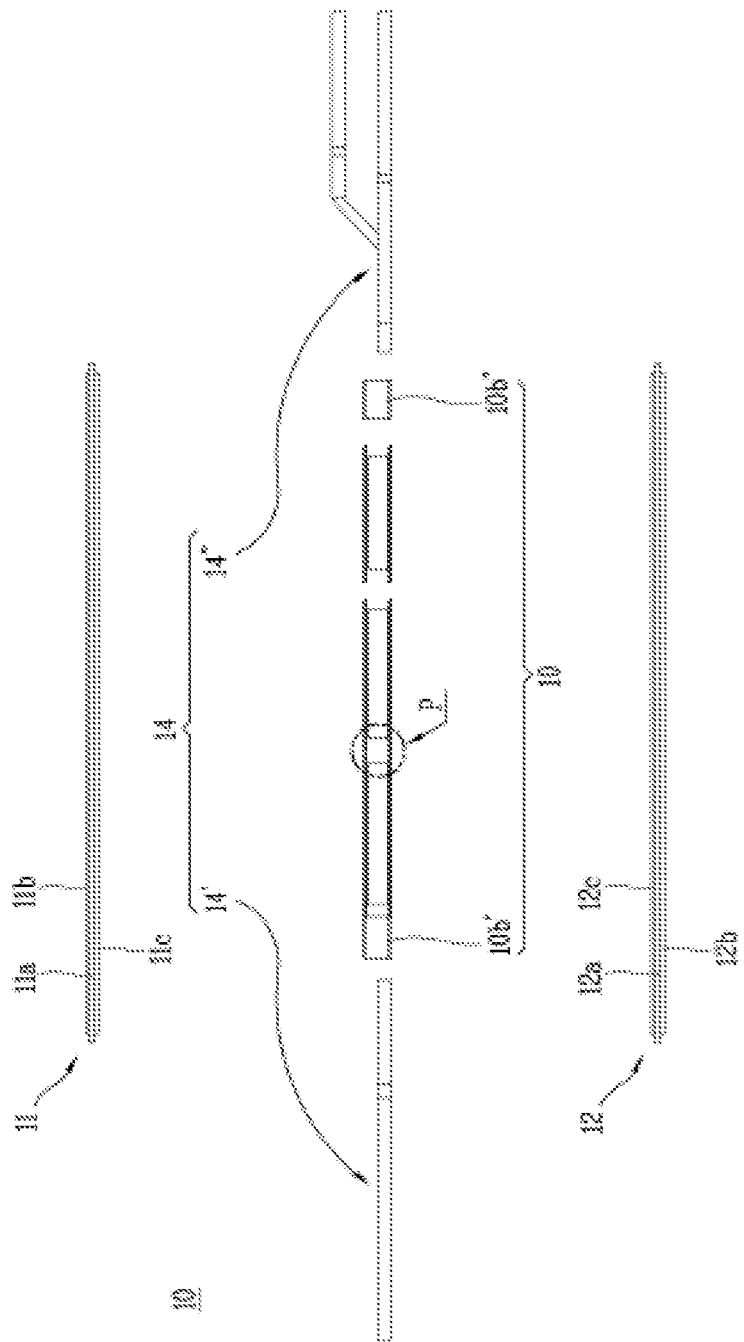
FIG. 4 is a conceptual view showing a configuration in which the power module illustrated in FIG. 3 is disassembled.
Figure 5:
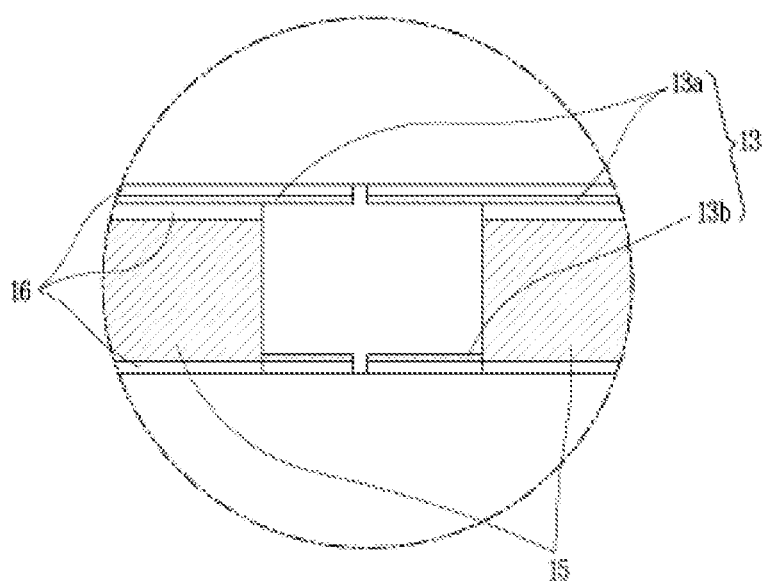
FIG. 5 is an enlarged conceptual view showing a region "P" illustrated in FIG. 4.

FIG. 1 is a perspective view showing an example of a power module 10 in the related art, and FIG. 2 is a perspective view showing an inside of the power module 10 illustrated in FIG. 1, and FIG. 3 is a conceptual view of the inside of the power module 10 illustrated in FIG. 2 when viewed from a lateral side, and FIG. 4 is a conceptual view showing a configuration in which the power module 10 illustrated in FIG. 3 is disassembled, and FIG. 5 is an enlarged conceptual view showing a region "P" illustrated in FIG. 4.

Referring to FIGS. 1 through 5, the power module 10 includes a first substrate 11 and a second substrate 12, an electronic device unit 13, a lead frame unit 14 and a spacer 15. Furthermore, the power module 100 may include a housing 10a as illustrated in FIG. 1. The housing 10a constitutes an external appearance of the power module 10, and is configured to surround and protect at least part of the first substrate 11 and the second substrate 12, the electronic device unit 13, the lead frame unit 14, and the spacer 15.

The first substrate 11 and the second substrate 12 are plates configured with an electrical circuit, and components constituting the electrical circuit may be provided on the first substrate 11 and the second substrate 12, respectively. The components constituting the electrical circuit may include an integrated circuit, a resistor, or the like, in addition to the electronic device unit 13.

At least either one of the first substrate 11 and the second substrate 12 may include dielectric layer portions 11a, 12a, first metal layer portions 11b, 12b, and second metal layer portions 11c, 12c, respectively.

The dielectric layer portions 11a, 12a may be configured to include an insulating material. The insulating material may include a ceramic substance. The dielectric layer portions 11a, 12a may include a first dielectric layer 11a provided on the first substrate 11 and a second dielectric layer 12a provided on the second substrate 12.

The first metal layer portions 11b, 12b and the second metal layer portions 11c, 12c may be disposed on both surfaces of the dielectric layer portions 11a, 12a, respectively. At least either one of the first and second metal layer portions 11b, 12b, 11c, 12c may be made of a copper material. The first metal layer portions 11b, 12b may be adhered onto the outer surfaces of the first dielectric layer 11a and the second dielectric layer 12a, respectively. On the contrary, the second metal layer portions 11c, 12c may be disposed on the inner surfaces of the first dielectric layer 11a and the second dielectric layer 12a, respectively.

The electronic device unit 13 is configured to implement a function of the power module 10, and may be provided in singular or plural numbers. The electronic device unit 13 may include a first electronic device 13a and a second electronic device 13a as illustrated in FIG. 5.

Between the electronic device unit 13 and the first substrate 11 and the second substrate 12, solder layers 16 made of solder to electrically connect the electronic device unit 13 and the first substrate 11 and the second substrate 12, respectively.

One side of the lead frame unit 14 is connected to an external circuit, and the other side thereof is electrically connected to the first substrate 11 or the second substrate 12. In FIGS. 3 and 4, it is shown that the lead frame unit 14 is electrically connected to the second substrate 12. In addition, the lead frame unit 14 may be provided in a plural number, and may be configured with a first lead frame 14' and a second lead frame 14", one side of which is connected to different regions of the external circuit, respectively.

The spacer 15 is disposed to have a predetermined thickness as illustrated in FIG. 5, and may be provided between the first substrate 11 or the second substrate 12 and the electronic device unit 13. The spacer 15 may be made of an electrically conductive material.

On the other hand, the power module 10 further includes a via spacer 10b.

The via spacer 10b is provided between the first substrate 11 and the second substrate 12, as illustrated in FIGS. 4 and 5, and both surfaces thereof are configured in contact with the first and second substrates 11, 12, respectively, to perform a function of electrically connecting the first and second substrates 11, 12. The via spacer 10b may be made of a copper material.

Meanwhile, the via spacer 10b may be provided in a plural number. For example, as illustrated in FIGS. 3 and 4, the via spacer 10b may include a first via spacer 10b' disposed at a position adjacent to the first lead frame 14' and a second via spacer 10b" disposed at a position adjacent to the second lead frame 14".

As described above, the power module 10 includes a via spacer 10b as a configuration for electrical connection between the first and second substrates 11, 12. Furthermore, the first and second substrates 11, 12 must secure a predetermined space for the placement of the via spacer 10b. In addition, an increase in electrical resistance of the power module 10 according to the configuration of the via spacer 10b exhibits a problem of increasing the heat generation amount of the power module 10.

Hereinafter, the power module 100 according to the present disclosure will be described.

Figure 6:
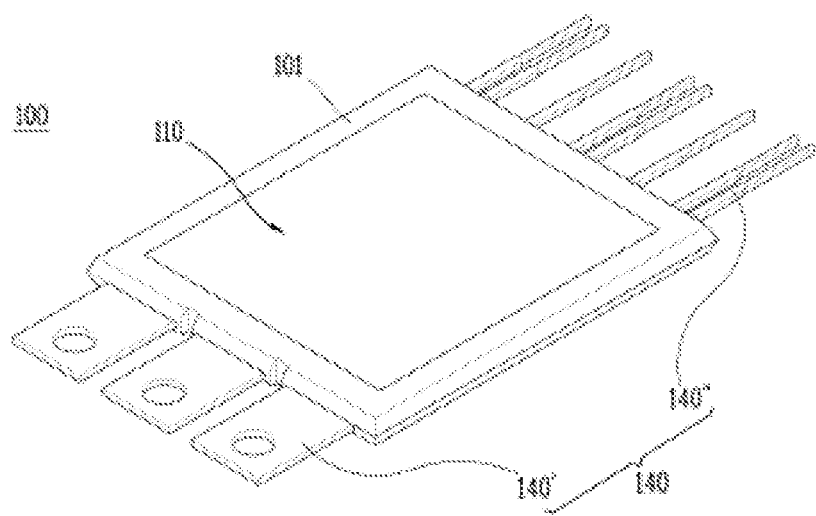
FIG. 6 is a perspective view showing an example of a power module according to the present disclosure.
Figure 7:
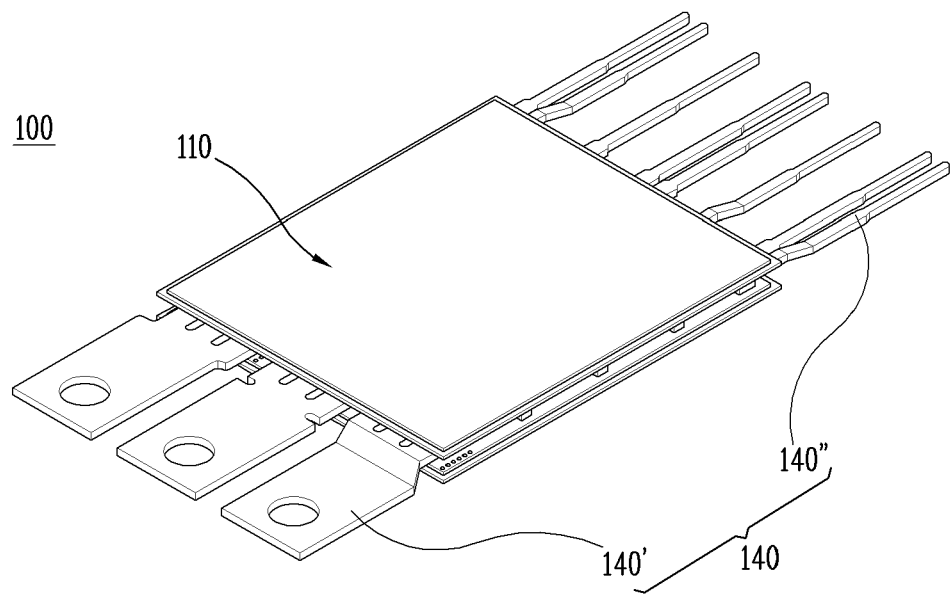
FIG. 7 is a perspective view showing an inside of the power module illustrated in FIG. 6.
Figure 8:
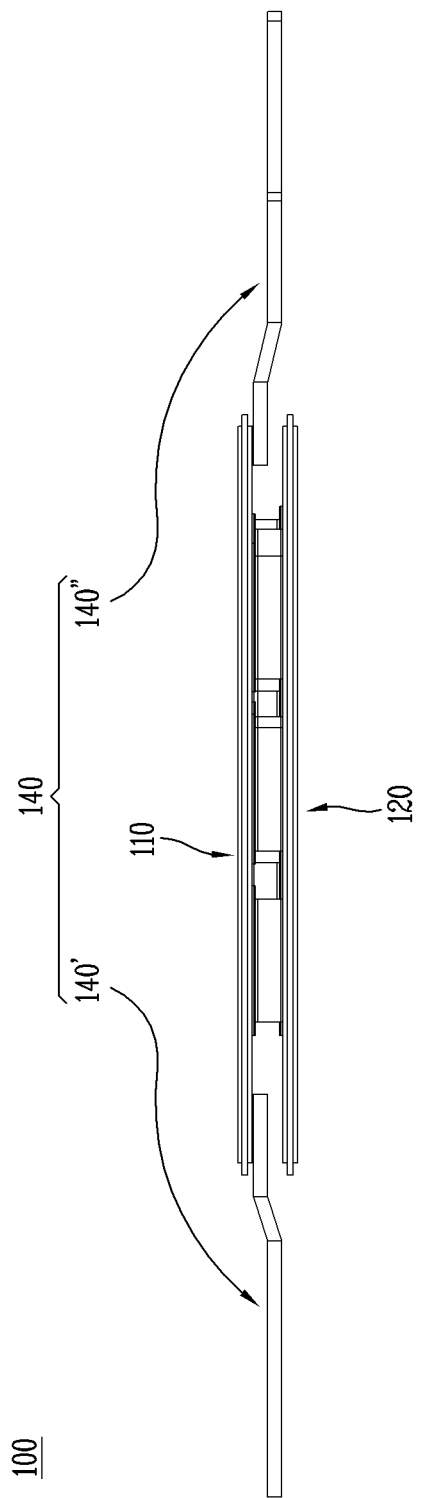
FIG. 8 is a conceptual view of the inside of the power module illustrated in FIG. 7 when viewed from a lateral side.
Figure 9:
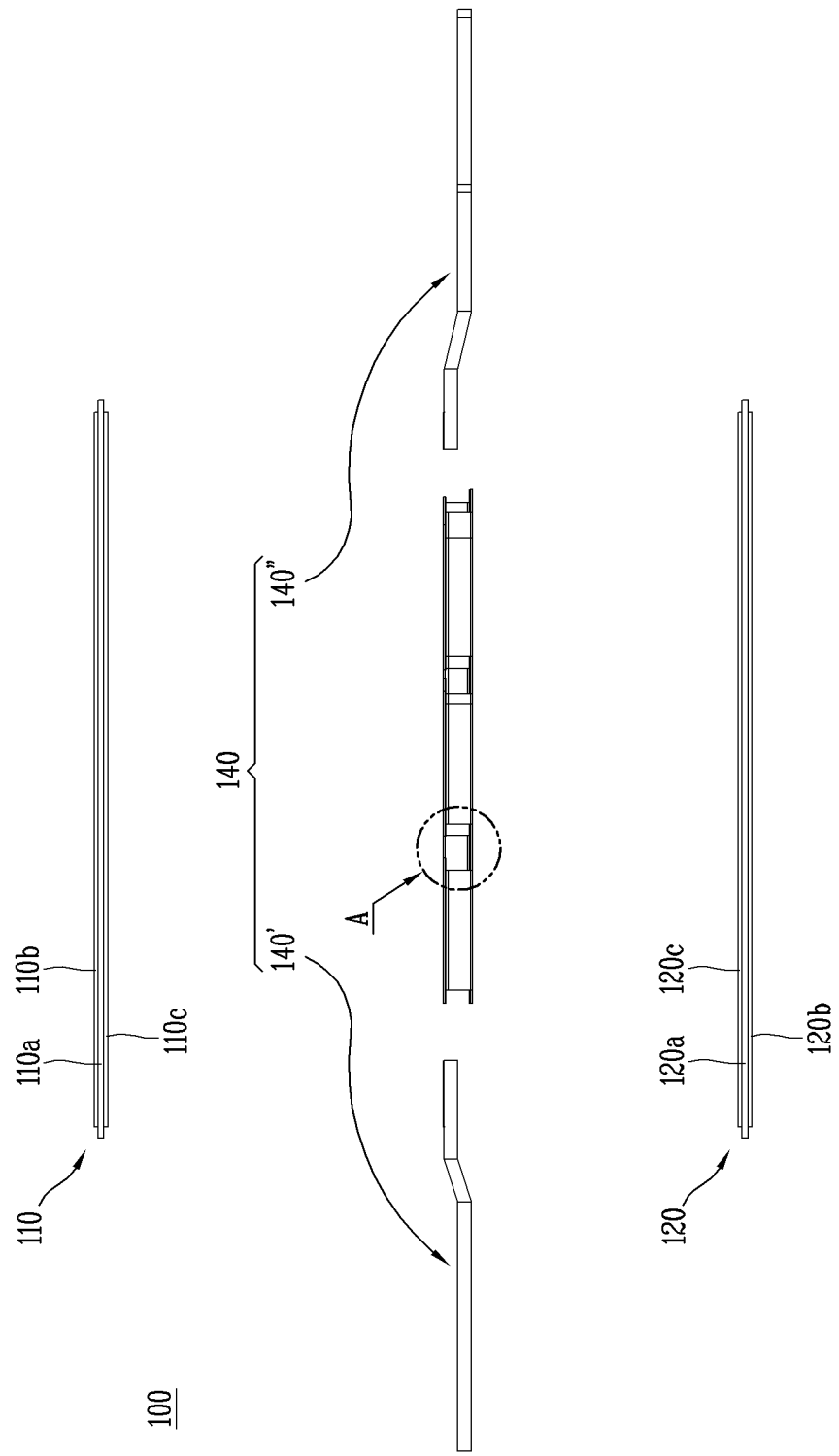
FIG. 9 is a conceptual view showing a configuration in which the power module illustrated in FIG. 8 is disassembled.
Figure 10:
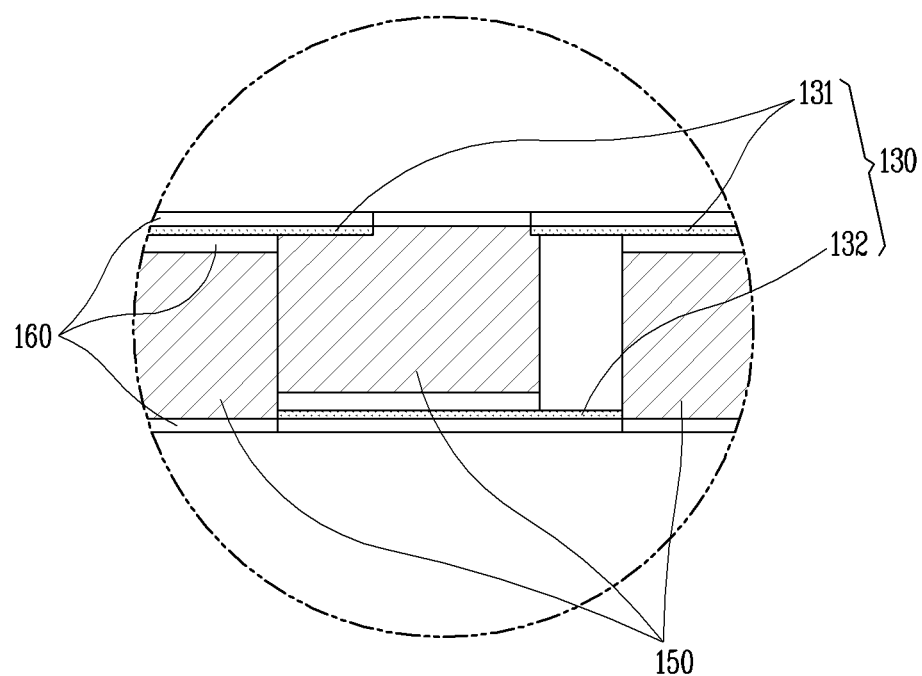
FIG. 10 is an enlarged conceptual view showing a region "A" illustrated in FIG. 9.
Figure 11:
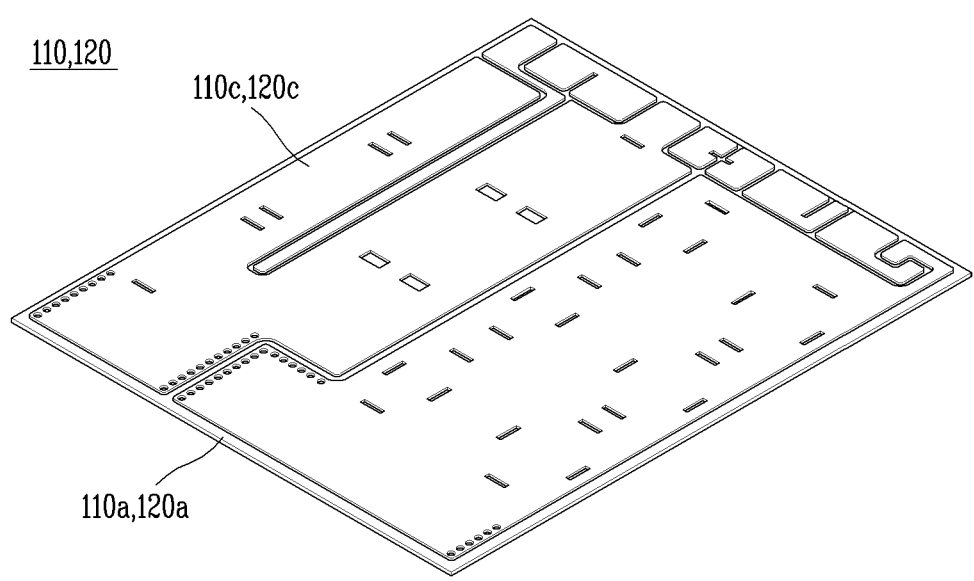
FIG. 11 is a perspective view showing an example of a first substrate and a second substrate illustrated in FIG. 9.
Figure 12:
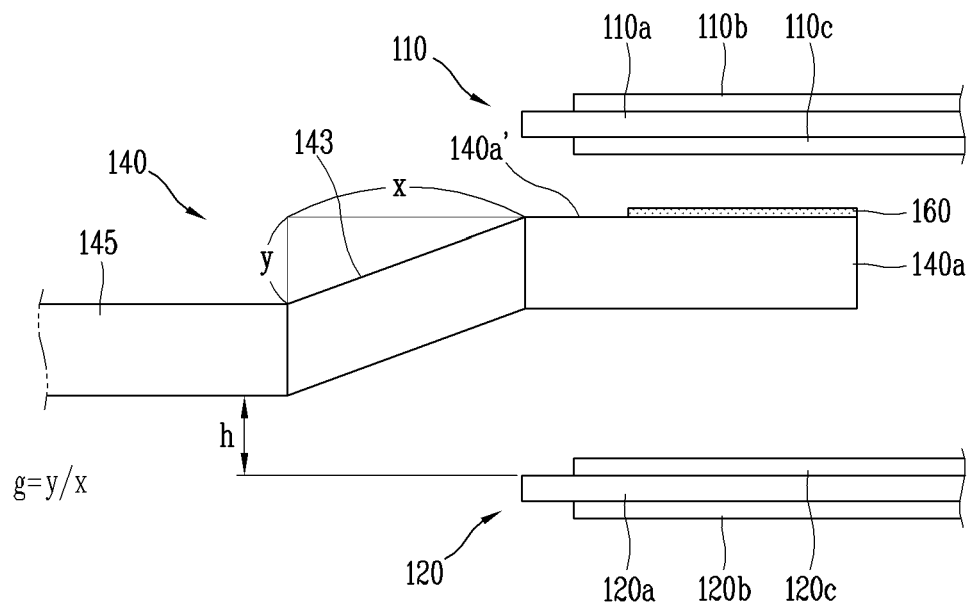
FIG. 12 is an enlarged conceptual view showing a lead frame unit illustrated in FIG. 9.

FIG. 6 is a perspective view showing an example of the power module 100 according to the present disclosure, and FIG. 7 is a perspective view showing an inside of the power module 100 illustrated in FIG. 6, and FIG. 8 is a conceptual view of the inside of the power module 100 illustrated in FIG. 7 when viewed from a lateral side, and FIG. 9 is a conceptual view showing a configuration in which the power module 100 illustrated in FIG. 8 is disassembled, and FIG. 10 is an enlarged conceptual view showing a region "A" illustrated in FIG. 9, and FIG. 11 is a perspective view showing an example of a first substrate 110 and a second substrate 120 illustrated in FIG. 9, and FIG. 12 is an enlarged conceptual view showing a lead frame unit 140 illustrated in FIG. 9.

Referring to FIGS. 6 through 12, the power module 100 is one of key components that constitute a power conversion device for an eco-friendly vehicle that uses electricity as a main power source. Furthermore, the power module 100 of the present disclosure may be applicable to all double side cooling type module components having two substrates. The two substrates may be configured with a first substrate 110 and a second substrate 120 spaced apart from each other, for example, as illustrated in FIG. 8.

The power module 100 of the present disclosure may include a first substrate 110, a second substrate 120, an electronic device unit 130, and a lead frame unit 140. In addition, the power module 100 may include a housing 101 as illustrated in FIG. 6. The housing 101 constitutes an external appearance of the power module 100, and is configured to surround and protect at least part of the first substrate 110 and the second substrate 120, the electronic device unit 130, and the lead frame unit 140.

The first substrate 110 and the second substrate 120 are plates configured with an electrical circuit, and components constituting the electrical circuit may be provided on the first substrate 110 and the second substrate 120, respectively. Components constituting the electrical circuit may include an integrated circuit or a resistor in addition to the electronic device unit 130, which will be described later. In addition, the first substrate 110 and the second substrate 120 may be spaced apart from each other at a predetermined interval, as illustrated in FIG. 8.

At least either one of the first substrate 110 and the second substrate 120 may include dielectric layer portions 110a, 120a, first metal layer portions 110b, 120b, and second metal layer portions 110c, 120c, respectively.

The dielectric layer portions 110a, 120a may be configured to include an insulating material. The insulating material may include a ceramic substance. The dielectric layer portions 110a, 120a may include a first dielectric layer 110a provided on the first substrate 110 and a second dielectric layer 120a provided on the second substrate 120.

The first metal layer portions 110b, 120b and the second metal layer portions 110c, 120c may be disposed on both surfaces of the dielectric layer portions 110a, 120a, respectively. At least either one of the first and second metal layer portions 110b, 120b, 110c, 120c may be made of a copper material. The first metal layer portions 110b, 120b may be adhered onto the outer surfaces of the first dielectric layer 110a and the second dielectric layer 120a, respectively. On the contrary, the second metal layer portions 110c, 120c may be disposed on the inner surfaces of the first dielectric layer 110a and the second dielectric layer 120a, respectively.

As illustrated in FIG. 11, various patterns having predetermined widths may be configured on the second metal layer portions 110c, 120c in contact with the electronic device unit 130 to provide a current path through which power and signals flow. In the power module 100 of the present disclosure, the via spacer 10b that has been applied to the power module 10 in the related art is removed, and it is not required to additionally secure a space for the placement of the via spacer 10b.

Accordingly, a pattern area provided on the first substrate 110 or the second substrate 120 may be increased to simply design the current path. In addition, in the case of the power module 100 of the present disclosure, the via spacer 10b that increases electrical resistance may be removed while simplifying the current path, thereby greatly reducing the value of electrical resistance in the power module 100. The electrical resistance is a resistance that hinders the flow of electric current, and the unit may be expressed in ohms when a degree of difficulty in passing electric current through an object is expressed as a numerical value.

The electronic device unit 130 is configured to implement a function of the power module 100, and may be provided in singular or plural numbers. When the electronic device unit 130 is provided in a plural number, the respective electronic device units 130 may be configured to be the same or different.

Between the electronic device unit 130 and the first substrate 110 and the second substrate 120, solder layers 160 made of solder to electrically connect the electronic device unit 130 and the first substrate 110 and the second substrate 120, respectively. Here, electrical connection between the electronic device unit 130 and the first and second substrates 110, 120 may be made in a manner other than the solder.

The electronic device unit 130 may be configured with a power semiconductor device. The power semiconductor device may be configured with either one of an IGBT (Insulated Gate Transistor), a bipolar, and a power MOSFET (Metal Oxide Silicon Field Effect Transistor), for example.

Meanwhile, the electronic device unit 130 may include a first electronic device 131 and a second electronic device 132 as illustrated in FIG. 10.

The first electronic device 131 may be provided on the first substrate 110. Furthermore, the first electronic device 131 may be provided in a plural number. The plurality of first electronic devices 131 may be configured to be the same or different from each other, or may be configured to be the same as or different from the second electronic device 132.

The second electronic device 132 may be provided on the second substrate 120. The second electronic device 132 may be provided in a plural number, similar to the first electronic device 131. The plurality of second electronic devices 131 may be configured to be the same or different from each other, and may be configured to be the same as or different from the first electronic device 131.

Here, the lead frame unit 140 may be configured to provide a power and signal transmission path between the first and second electronic devices 131, 132 and an external circuit. The lead frame unit 140 is provided between the first and second substrates 110, 120 to electrically connect the first and second substrates 110, 120. The more detailed description of the lead frame unit 140 will be described later.

One side of the lead frame unit 140 is connected to an external circuit, and the other side thereof is made to electrically connect the first and second substrates 110, 120. The external circuit denotes a circuit electrically connected to the power module 100 from an outside of the power module 100. The external circuit may be configured with for example, other components in the power conversion device associated with the power module 100. The lead frame unit 140 may be made of an electrically conductive material.

On the other hand, the lead frame unit 140 may be provided in a plural number, and may be configured with a first lead frame 140' and a second lead frame 140", one sides of which are connected to different regions of the external circuit, respectively.

The first lead frame 140' and the second lead frame 140" may be configured such that one sides thereof are connected to different regions of the external circuit, respectively.

Here, the other side of at least either one of the first and second lead frames 140' and 140" is configured in contact with the first substrate 110 to electrically connect the first and second substrates 110, 120.

For example, the other side of the first lead frame 140' may be configured in contact with the first substrate 110 to electrically connect the first and second substrates 110, 120. In other words, the first and second substrates 110, 120 may be electrically connected to each other through the first lead frame 140'.

In addition, in FIG. 7 through FIG. 9, it is illustrated that the other side of the second lead frame 140" is in contact with the first substrate 110, but on the contrary, the other side of the second lead frame 140" may be configured in contact with the second substrate 120. In other words, electrical connection between the first and second substrates 110, 120 may be implemented through the first lead frame 140', and other lead frames of the power module 100, for example, the second lead frame 140" may be configured in contact with only the second substrate 120 regardless of electrical connection between the first and second substrates 110, 120.

In addition, each of the first lead frame 140' and the second lead frame 140" may be configured to provide a transmission path for at least either one of power and signals through the external circuit. For example, the first lead frame 140' may be configured to provide a transmission path for power, and the second lead frame 140" may be configured to provide a transmission path for signals.

Meanwhile, the power module 100 may further include a spacer 150.

The spacer 150 is disposed to have a predetermined thickness as illustrated in FIG. 10, and may be provided between the first substrate 110 or the second substrate 120 and the electronic device unit 130. The spacer 150 may be configured to cover a predetermined portion of one surface of the electronic device unit 130. Both sides of the spacer 150 may be respectively provided with a solder layer 160 made of solder to electrically connect the electronic device unit 130 and the first substrate 110 or the second substrate 120 and the spacer 150. In addition, the spacer 150 may be made of an electrically conductive material.

Meanwhile, the lead frame unit 140 may include a contact portion 140a.

The contact portion 140a may be provided on the other side of the lead frame unit 140, and configured to have a contact surface 140a' in contact with one surface of the first substrate 110 facing the second substrate 120. Furthermore, on the contact surface 140a', the solder layer 160 made of solder to electrically connect the second metal layer portion 110c of the first substrate 110 to the contact portion 110 may be provided.

In addition, the contact portion 140a may be configured to have elasticity that is deformed toward one surface of the first substrate 110 facing the second substrate 120. According to the configuration of the contact portion 140a, in the process of manufacturing the power module 100, a contact state between the contact surface 140a' of the contact portion 140a and one surface of the first substrate 110 may be stably maintained. In other words, electrical connection between the contact surface 140a of the lead frame unit 140 and one surface of the first substrate 110 may be more stably implemented.

Meanwhile, the lead frame unit 140 may further include an inclined portion 143.

The inclined portion 143 is provided on the other side of the lead frame unit 140, and configured to be inclined toward one surface of the first substrate 110 facing the second substrate 120, and configured to define a slope (g) having a predetermined amount with respect to one surface of the first substrate 110 facing the second substrate 120. Here, the slope (g) may be expressed by a value obtained by dividing a vertical length (y) of the inclined portion 143 by a horizontal length (x) of the inclined portion 143.

On the other hand, although not shown in the drawings of the present disclosure, at least part of the inclined portion 143 may be made to have a curved surface shape. Moreover, the inclined portion 143 may be provided in a plural number, and when the inclined portion 143 is provided in a plural number, at least part of the inclined portions 143 may be configured to have different inclinations (g).

An amount of the slope (g) may be designed differently according to a separation distance between the first substrate 110 and the second substrate 120. Furthermore, an amount of the slope (g) may be designed differently according to a difference in height (h) from one surface of the second substrate 120 to a bottom surface of the terminal portion 145. In addition, as the amount of the slope (g) is adjusted, the positions of the contact portions 140a and the contact surfaces 140a' on the power module 100 may be variously designed.

Meanwhile, the lead frame unit 140 may further include the terminal portion 145.

The terminal portion 145 may be provided on one side of the lead frame unit 140 to be connected to the external circuit. The external circuit may be configured with for example other components in the power conversion device associated with the power module 100. The terminal portion 145 may be inserted into and fastened to the corresponding external circuit, or may be fastened and fixed to the corresponding external circuit through a separate collecting member. At least either one of power and signals may flow through the terminal portion 145.

Here, a bottom surface of the terminal portion 145, as illustrated in FIG. 12, may be disposed at the same height as one surface of the second substrate 120 facing the first substrate 110, for example, one surface of the second metal layer portion 120c.

Hereinafter, another example of the lead frame unit 140 will be described with reference to FIG. 13.

Figure 13:
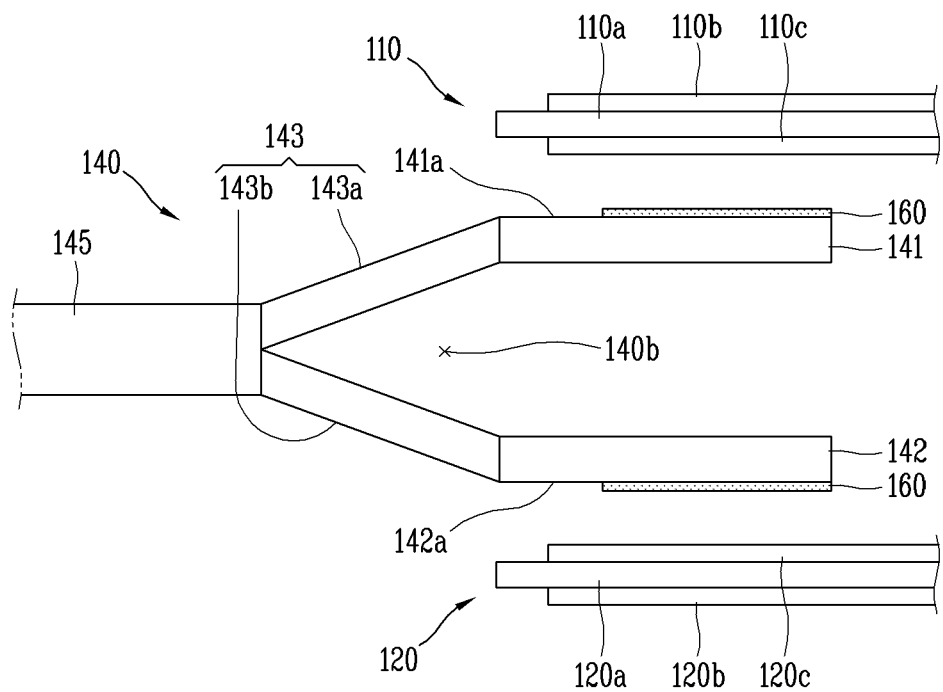
FIG. 13 is a conceptual view showing another example of the lead frame unit illustrated in FIG. 12.

FIG. 13 is a conceptual diagram showing another example of the lead frame unit 140 illustrated in FIG. 10.

Referring to FIG. 13, the lead frame unit 140 may include a first portion 141 and a second portion 142.

The first portion 141 may be provided on the other side of the lead frame unit 140, and configured to have a first contact surface 141a, which is a region in contact with one surface of the first substrate 110 facing the second substrate 120.

The second portion 142 is provided on the other side of the lead frame unit 140, and configured to have a second contact surface 142a, which is a region in contact with one surface of the second substrate 120 facing the first substrate 110, unlike the first portion 142. In addition, the first portion 141 and the second portion 142 may be made of the same material as each other, or may be made of different materials from each other.

Here, the first portion 141 and the second portion 142 may be spaced apart from each other at a predetermined interval to define a gap portion 140b between the first portion 141 and the second portion 142. In other words, respective one surfaces of the first portion 141 and the second portion 142 facing each other may be spaced apart from each other.

According to the structure of the first portion 141 and the second portion 142 as described above, the lead frame unit 140 performs a function of electrically connecting the first and second substrates 110, 120 as well as providing a transmission path for power and/or signals between the substrate 110 and the external circuit or independently providing a transmission path for power and/or signals between the second substrate 120 and the external circuit.

Furthermore, at least either one of the first portion 141 and the second portion 142 may have elasticity deformed toward one surface of the first substrate 110 or one surface of the second substrate 120, respectively. In other words, the first portion 141 may be configured to have elasticity deformed toward one surface of the first substrate 110 facing the second substrate 120, and the second portion 142 may be configured to have elasticity deformed toward one surface of the second substrate 120 facing the first substrate 110.

According to the structure of the first portion 141 and the second portion 142, a contact state between the first contact surface 141a of the first portion 141 and one surface of the first substrate 110 may be stably maintained, and likewise, a contact state between the second contact surface 142a of the second portion 142 and one surface of the second substrate 120 may be stably maintained.

Hereinafter, another example of the lead frame unit 140 will be described with reference to FIG. 14.

FIG. 14 is a conceptual view showing still another example of the lead frame unit 140 illustrated in FIG. 10.

Referring to FIG. 14, the lead frame unit 140 may include a first portion 141 and a second portion 142.

The first portion 141 may be provided on the other side of the lead frame unit 140, and configured to have a first contact surface 141a, which is a region in contact with one surface of the first substrate 110 facing the second substrate 120.

The first portion 142 may be provided on the other side of the lead frame unit 140, and configured to have a second contact surface 142a, which is a region in contact with one surface of the second substrate 120 facing the first substrate 110. According to the structure of the first portion 141 and the second portion 142, a transmission path for power and/or signals between the first and second substrates 110, 120 and the external circuit may be independently implemented. In addition, the first portion 141 and the second portion 142 may be made of the same material as each other, or may be made of different materials from each other.

Here, the first portion 141 and the second portion 142 may be disposed such that one surfaces facing each other are brought into contact with each other to constitute a single body, as illustrated in (a) and (b) of FIG. 14. According to the structure of the first portion 141 and the second portion 142 as described above, a thickness of the other side of the lead frame unit 140 may be defined to be different from that of the first and second portion 141 and 142 in the lead frame unit 140 described with reference to FIG. 13 in the above to define different electrical resistances from each other. In general, for electrical resistance, thick conductors have a smaller value than thin conductors, and short conductors have a smaller value than long conductors.

In other words, the first portion 141 and the second portion 142 may be made to exhibit different electrical resistances on the other side of the lead frame unit 140 depending on whether or not one surfaces facing each other are disposed in contact with each other. Accordingly, the power module 100 of the present disclosure may implement more various electric resistances as required.

Meanwhile, the lead frame unit 140 may include an inclined portion 143.

The inclined portion 143 may be provided on the other side of the lead frame unit 140, and may be disposed to be inclined toward at least either one between one sides of the first and second substrates 110 and 120 facing each other.

In addition, the inclined portion 143 may include a first inclined surface 143a and a second inclined surface 143b.

The first inclined surface 143a may be disposed to be inclined toward one surface of the first substrate 110 facing the second substrate 120.

On the contrary, the second inclined surface 143b may be disposed to be inclined toward one surface of the second substrate 120 facing the first substrate 110.

On the other hand, the first inclined surface 143a may be configured to define a first slope (g1) with respect to one surface of the first substrate 110 facing the second substrate 120. Furthermore, the second inclined surface 143b may be configured to define a second slope (g2) with respect to one surface of the second substrate 120 facing the first substrate 110. Here, the first slope (g1) may be expressed as a value obtained by dividing a vertical length (y1) of the first inclined surface 143a by a horizontal length (x1) of the first inclined surface 143a. In addition, the second slope (g1) may be expressed as a value obtained by dividing a vertical length (y2) of the second inclined surface 143b by a horizontal length (x2) of the second inclined surface 143b.

Here, the first inclined surface 143a and the second inclined surface 143b may be defined such that the first and second slopes g1, g2 are the same as illustrated in (a) of FIG. 14. Alternatively, the first inclined surface 143a and the second inclined surface 143b may be disposed such that the first and second slopes (g1, g2) are different from each other as illustrated in (b) of FIG. 14. For example, the first and second inclined surfaces 143a, 143b may be disposed such that the first slope (g1) is smaller than the second slope (g2), as illustrated in (b) of FIG. 14.

According to the structure of the first inclined surface 143a and the second inclined surface 143b, a relative position of the terminal portion 145 of the lead frame 140 with respect to one side of the first substrate 110 or the second substrate 120 facing each other may be designed in more various ways.

For example, when the first and second slopes (g1, g2) are equal to each other, the terminal portion 145 may be positioned on an intermediate height between the first and second substrates 110, 120. On the contrary, when the first slope (g1) is defined to be smaller than the second slope (g2), the terminal portion 145 may be disposed at a position closer to one side of the first substrate 110 between one sides of the first and second substrates 110 and 120 facing each other.

According to the configuration of the power module 100 described above, instead of the via spacer 10b in the related art, the lead frame unit 140 may perform a function of electrically connecting the first substrate 110 and the second substrate 120. In other words, electrical connection between the first substrate 110 and the second substrate 120 may be implemented through the lead frame unit 140 without having the via spacer 10b.

In addition, as the structure of the via spacer 10b is removed, a factor of increasing electrical resistance due to the via spacer 10b may be removed together. Accordingly, electrical resistance may be reduced compared to the conventional power module 10 having the via spacer 10b. Furthermore, as electric resistance in the power module 100 is reduced compared to the related art, the heat generation amount of the power module 100 may be lowered to further secure the reliability of the power module 100 while improving the durability of the power module 100.

In addition, as the configuration of the via spacer 10b in the related art is removed from the power module 100, raw material values for the via spacer 10b may be reduced in the process of manufacturing the power module 100. Moreover, while the number of components of the power module 100 is reduced to simplify manufacturing process, the assembly performance of the power module 100 may be further improved. Furthermore, according to the power module 100 of the present disclosure, an overall structure of the power module 100 may be designed in a more balanced manner as the via spacer 10b in the related art is removed.

According to the present disclosure having the above configuration, the power module may include a lead frame unit provided between the first substrate and the second substrate spaced apart from each other, one side of which is connected to an external circuit. Here, the other side of the lead frame unit is made to electrically connect the first substrate and the second substrate.

Accordingly, in the case of the power module of the present disclosure, instead of the via spacer in the related art, the lead frame unit may perform a function of electrically connecting the first and second substrates. In other words, without having a via spacer applied to a power module in the related art, electrical connection between the first substrate and the second substrate may be implemented through the lead frame unit.

As such, as the structure of the via spacer in the related art is removed from the power module, a factor of increasing electrical resistance due to the via spacer may also be removed, thereby reducing electrical resistance compared to the power module having the via spacer in the related art. In addition, a heat generation amount of the power module may be reduced according to a decrease in electrical resistance, thereby securing reliability and improving durability in the power module.

Moreover, as the configuration of the via spacer in the related art is removed from the power module, the number of components of the power module may be reduced, thereby simplifying manufacturing process and improving assembly performance in the power module. Furthermore, as the via spacer in the related art is removed, an overall structure of the power module may be designed in a more balanced manner.

What is claimed is:

1. A power module, comprising:
   a first substrate and a second substrate,
   wherein the first substrate and the second substrate are configured with space between the substrates;
   an electronic device unit provided on at least one of the first and second substrates; and
   a lead frame unit, a first side of which is configured to connect to an external circuit, and a second side of which is provided between the first and second substrates to electrically connect the first and second substrates,
   wherein the lead frame unit comprises:
      a first portion, provided at the second side of the lead frame unit, having a first contact surface in contact with the surface of the first substrate facing the second substrate;
      a second portion, provided at the second side of the lead frame unit, having a second contact surface in contact with the surface of the second substrate facing the first substrate;
      a terminal portion provided at the first side of the lead frame unit and configured to be connected to the external circuit, and
      inclined portions provided at the second side of the lead frame unit, and inclined towards the first and second substrates facing each other,
      wherein the first portion and the second portion are spaced apart from each other by a predetermined interval defining a gap portion between the first and second portions, and
      wherein the inclined portions comprise:
         a first inclined surface inclined towards the surface of the first substrate facing the second substrate, the first inclined surface connecting the terminal portion and the first portion; and
         a second inclined surface inclined towards the surface of the second substrate facing the first substrate, the second inclined surface connecting the terminal portion and the second portion, wherein the power module further comprises:
a spacer provided between the electronic device unit and one of the first and second substrates,
wherein both sides of the spacer are respectively provided with a solder layer made of solder to electrically connect the electronic device unit and the first substrate or the second substrate and the spacer,
wherein the spacer is made of an electrically conductive material, wherein the electronic device unit further comprises:
a first electronic device provided on the first substrate; and
a second electronic device provided on the second substrate, and
wherein the lead frame unit provides a transmission path for power and signals between the first and second electronic devices and the external circuit.

2. The power module of claim 1, wherein the lead frame unit is provided in plurality, and includes a first lead frame and a second lead frame, respective first sides of which are configured to connect to different regions of the external circuit, and
at least one second side of the first or second lead frames is in contact with the first substrate to electrically connect the first and second substrates.

3. The power module of claim 2, wherein each of the first and second lead frames provides a transmission path for at least one of power and signals through the external circuit.

4. The power module of claim 1, wherein at least one of the first portion and the second portion is configured to deform towards the surface of the first substrate facing the second substrate or the surface of the second substrate facing the first substrate.

5. The power module of claim 1, wherein the first inclined surface is configured to define a first slope with respect to the surface of the first substrate facing the second substrate, and the second inclined surface is configured to define a second slope with respect to the surface of the second substrate facing the first substrate,
wherein the first and second inclined surfaces are disposed such that the first and second slopes are different from each other.

6. The power module of claim 1, wherein the first inclined surface is configured to define a first slope with respect to the surface of the first substrate facing the second substrate, and the second inclined surface is configured to define a second slope with respect to the surface of the second substrate facing the first substrate,
wherein the first and second inclined surfaces are disposed such that the first and second slopes are the same as each other.

7. The power module of claim 1, wherein at least one of the first substrate and the second substrate comprises:
a dielectric layer portion made of a dielectric material; and
a first metal layer portion and a second metal layer portion made of metal, and respectively bonded onto opposite sides of the dielectric layer portion.

8. The power module of claim 7, wherein at least one of the first metal layer portion and the second metal layer portion is made of copper.

\* \* \* \* \*